(12) United States Patent
Clevenger et al.

(10) Patent No.: US 6,337,513 B1
(45) Date of Patent: Jan. 8, 2002

(54) CHIP PACKAGING SYSTEM AND METHOD USING DEPOSITED DIAMOND FILM

(75) Inventors: Lawrence A. Clevenger, LaGrangeville; Louis L. Hsu, Fishkill, both of NY (US); Li-Kong Wang, Montvale, NJ (US); Tsorng-Dih Yuan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/449,886

(22) Filed: Nov. 30, 1999

(51) Int. Cl.[7] .................. H01L 23/48; H01L 23/52; H01L 23/34; B24B 1/00
(52) U.S. Cl. .................. 257/706; 257/77; 257/930; 257/778; 257/738; 257/737; 257/712; 257/777; 257/469; 257/442; 257/729; 257/624; 257/627
(58) Field of Search ................ 257/706, 712, 257/713, 777, 778, 737, 739, 738, 779, 781, 772, 690, 692, 693, 77, 640, 649, 347, 442, 434, 469, 730, 622, 626, 627, 632

(56) References Cited

U.S. PATENT DOCUMENTS

| | | | | |
|---|---|---|---|---|
| 4,597,714 A | * | 7/1986 | Morrison et al. .......... 414/729 |
| 4,979,015 A | * | 12/1990 | Stierman et al. | |
| 4,996,116 A | * | 2/1991 | Webster et al. ............ 428/427 |
| 5,308,980 A | * | 5/1994 | Barton .................... 250/338.4 |
| 5,334,342 A | * | 8/1994 | Harker et al. .............. 206/317 |
| 5,364,923 A | * | 11/1994 | Beyer et al. | |
| 5,387,555 A | * | 2/1995 | Linn et al. | |
| 5,423,475 A | * | 6/1995 | Burke ....................... 228/193 |
| 5,573,979 A | * | 11/1996 | Tsu et al. | |
| 5,647,998 A | * | 7/1997 | Potter ......................... 216/24 |
| 5,650,639 A | * | 7/1997 | Schrantz et al. ............. 257/77 |
| 5,679,264 A | * | 10/1997 | Cohen et al. ................ 257/77 |
| 5,683,939 A | * | 11/1997 | Schrantz et al. | |
| 5,744,383 A | * | 4/1998 | Fritz ......................... 438/111 |
| 5,744,865 A | * | 4/1998 | Jeng et al. ................. 257/750 |
| 5,747,918 A | * | 5/1998 | Eom et al. ................. 313/309 |
| 5,750,243 A | * | 5/1998 | Shikata et al. ............. 428/216 |
| 5,796,714 A | * | 8/1998 | Chino et al. ................ 372/50 |
| 5,855,998 A | * | 1/1999 | Tanabe et al. ............. 428/261 |
| 5,874,775 A | * | 2/1999 | Shiomi et al. .............. 257/712 |
| 5,897,924 A | * | 4/1999 | Ulczynski et al. .......... 427/577 |
| 5,899,728 A | * | 5/1999 | Mangat et al. ............. 438/459 |
| 5,902,686 A | * | 5/1999 | Mis ............................. 428/629 |
| 5,909,280 A | * | 6/1999 | Zavracky ................... 356/352 |
| 5,977,697 A | * | 11/1999 | Jin et al. ................... 313/310 |
| 6,124,198 A | * | 9/2000 | Moslehi ..................... 438/622 |

* cited by examiner

Primary Examiner—Alexander O. Williams
(74) Attorney, Agent, or Firm—Robert M. Trepp; Anne Vachon Dougherty

(57) ABSTRACT

A chip packaging system and method for providing enhanced thermal cooling including a first embodiment wherein a diamond thin film is used to replace at least the surface layer of the existing packaging material in order to form a highly heat conductive path to an associated heat sink. An alternative embodiment provides diamond thin film layers disposed on adjacent surfaces of the chip and the chip package. Yet another alternative embodiment includes diamond thin film layers on adjacent chip surfaces in a chip-to-chip packaging structure. A final illustrated embodiment provides for the use of an increased number of solder balls disposed in at least one diamond thin film layer on at least one of a chip and a chip package joined with standard C4 technology.

17 Claims, 6 Drawing Sheets

| 32mm SUBSTRATE | WITH DIAMOND | WITHOUT DIAMOND (STD C4) |
|---|---|---|
| CHIP 1 (15W) CHIP 2 (5W) at 3 C/W at 27°C | 77.3C | 88.2C |
FIG.5
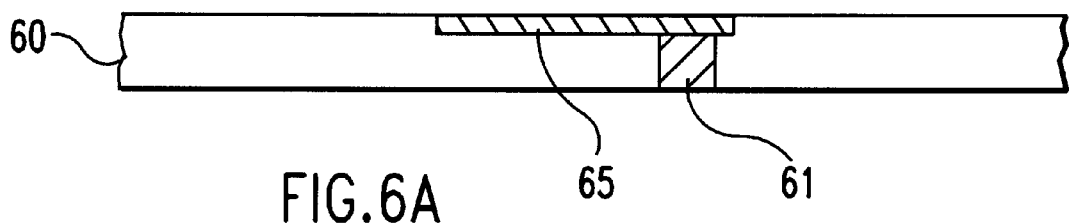
FIG.6A
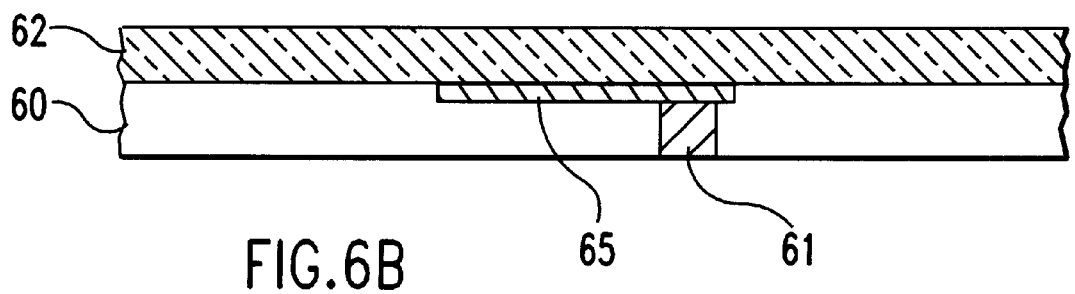
FIG.6B

CHIP PACKAGING SYSTEM AND METHOD USING DEPOSITED DIAMOND FILM

CROSS REFERENCE TO RELATED APPLICATION

This application is related to U.S. patent application, Ser. No. 09/362,399, entitled "Method and Structure for Providing Improved Thermal Conduction for Silicon Semiconductor Devices", which was filed on Jul. 28, 1999 and is assigned to the present assignee.

The present application is also related to U.S. patent application Ser. No. 09/006,575, of Joshi, et al, entitled "Embedded Thermal Conductors for Semiconductor Chips", filed on Jan. 13, 1998 and currently under allowance, and its divisional case Ser. No. 09/296,846 filed Apr. 22, 1999, both of which are assigned to the present assignee.

FIELD OF THE INVENTION

This invention relates to semiconductor chip packaging, and, more particularly, to a method and structure for providing improved diamond thermal conduction structures for semiconductor devices.

BACKGROUND OF THE INVENTION

As the silicon chip technology drives for speed, density and integration, the power dissipation problems can significantly limit the system performance and reliability and the chip sizes. In addition, thermal management for effective heat removal and temperature equalization becomes more challenging as density and integration demands increase. Semiconductor chips require cooling to sustain reliability of circuits and interconnects formed on and in the semiconductor chips, to optimize circuit switching performance, and to suppress thermally generated noise in the circuits.

Although is has been demonstrated that, by placing processor and peripheral chips, such as cache memory, directory and multimedia chips in the same package, one can greatly improve the speed, bandwidth and power reductions, the attendant temperature increase induces performance degradation, reduction in reliability, and mechanical failure, greatly setting back the overall performance.

As a result, a myriad of cooling structures have been devised for incorporation into the semiconductor chip structure itself and for use in the mounting of semiconductor chips. Cooling may be provided for an entire circuit board, may be applied selectively to individual chips, or may be provided on-chip to dissipate heat from individual hot spots within a chip. An example of a prior art cooling solutions is U.S. Pat. No. 5,621,616 of A.H. Owens, wherein a high conductivity thermal transfer pathway is created, using multiple metal layers and vias, to draw heat away from the bulk silicon semiconductor substrate. Owens additionally proposes embedding metal plugs into a chip substrate to collect heat generated by transistors and remove the heat through metal interconnects in the chips.

Yet another proposed solution is found in U. S. patent application Ser. No. 09/006,575, of Joshi, et al, entitled "Embedded Thermal Conductors for Semiconductor Chips", filed on Jan. 13, 1998 and currently under allowance, and its divisional case Ser. No. 09/296,846 filed Apr. 22, 1999, both of which are assigned to the present assignee. In accordance with the teachings of those applications, the contents of which are incorporated by reference herein, back-side diamond thermal paths are provided effectively to act as cooling fins; or alternatively, front-side shallow trench diamond thermal conductors are provided in contact with the devices at the substrate surface and extend through the buried oxide layer to contact the underlying bulk silicon. The shallow trench diamond structures provide both electrical isolation between devices and thermal conduction of heat away from the devices. A disadvantage to the former Joshi structure is that back-side cooling does nothing for dissipating heat away from the front-side-mounted devices. A disadvantage to the latter Joshi front-side structure and method is that the trenches are formed prior to device fabrication. As a result, the diamond in the trenches must be recessed and covered to protect it from the subsequent processing steps; thereby requiring numerous additional processing steps and resulting in an unusual structural profile.

It is therefore an objective of the present invention to provide improved cooling of semiconductor chips.

It is additionally an objective of the invention to provide a chip package which provides enhanced thermal cooling of the chips mounted thereon.

Yet another objective of the invention is to provide an alternative chip mounting structure which provides improved heat dissipation.

SUMMARY OF THE INVENTION

These and other objectives are realized by the present invention including a first embodiment wherein a diamond thin film is used to replace at least the surface layer of the existing packaging material in order to form a highly heat conductive path to an associated heat sink. An alternative embodiment provides diamond thin film layers disposed on adjacent surfaces of the chip and the chip package. Yet another alternative embodiment includes diamond thin film layers on adjacent chip surfaces in a chip-to-chip packaging structure. A final illustrated embodiment provides for the use of an increased number of solder balls disposed in at least one diamond thin film layer on at least one of a chip and a chip package joined with standard C4 technology.

BRIEF DESCRIPTION OF THE DRAWINGS

The present invention will be detailed with specific reference to the appended drawings of which:

FIG. 5 provides a table showing simulated thermal cooling results for the inventive embodiment illustrated in FIG. 4; and FIGS. 6A through 6F provide illustrations of processing steps for a representative process flow in accordance with the present invention.

DESCRIPTION OF THE PREFERRED EMBODIMENT

Figure 1:
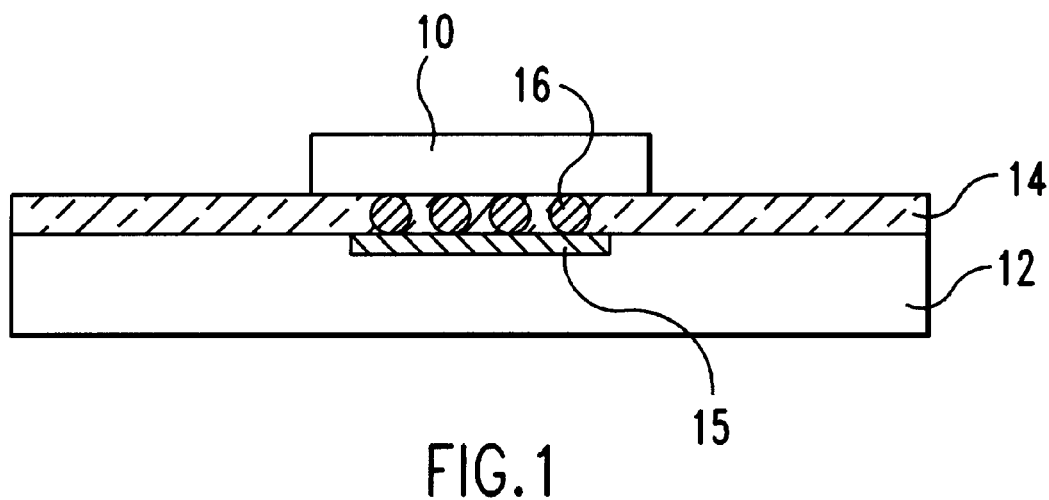
FIG. 1 provides a schematic illustration of a silicon on silicon package in accordance with the present invention.

The present invention will be described with reference to multi-chip type packaging using C4 structures which are typically utilized for high end computer system applications. It is to be understood that the diamond films of the present invention are applicable for providing cooling in other chip mounting structures as well. The invention utilizes diamond thin films on each of the embodiments including a first embodiment wherein a diamond thin film is used to replace at least the surface layer of the existing packaging material in order to form a highly heat conductive path to an associated heat sink; an alternative embodiment which provides diamond thin film layers disposed on adjacent surfaces of the chip and the chip package; yet another alternative embodiment including diamond thin film layers on adjacent chip surfaces in a chip-to-chip packaging structure; and, a final illustrated embodiment which provides for the use of an increased number of solder balls disposed in at least one diamond thin film layer on at least one of a chip and a chip package joined with standard C4 technology.

Each of the foregoing structures are preferably fabricated of diamond or diamond-like materials, for example diamond-like carbon or silicon carbide (hereinafter collectively referred to as "diamond"). Diamond has a high thermal conductivity, which is more than 14 times that of silicon, and is an electrical insulator. Diamond also adheres well to silicon. The properties of chemical vapor deposited (CVD) diamond are given in Table 1, as compared to those properties for silicon and silicon dioxide:

TABLE I

| PROPERTIES | MATERIAL | | |
|---|---|---|---|
| | Diamond | Silicon | Silicon Dioxide |
| Thermal conductivity (W/m-K) | 1000–2000 | 110–150 | 0.1 to 1.5 |
| Dielectric constant | 5.7 | 11.8 | 3.9 |
| (CTE) TCE ($x10^{-6}$ cm/° C.) | 2.8 | 2.5 | 0.55 |

As taught in the aforementioned Joshi, et al patent applications, a hot wall filament chemical vapor deposition system may be used to process diamond to create films. Diamond films may be deposited using a gas mixture of $CH_4$ and $H_2$ under high pressure, for example 30–40 Torr, varying the temperature from 600–1100° C. The gas mixture may include about 10–30% volume $CH_4$ and about 70–90% $H_2$, although other gases may be present. The diamond layers can be blanket deposited and subsequently etched using reactive ion etching.

Alternative methods for depositing polycrystalline diamond on single crystalline silicon include a microwave plasma system, an RF plasma system which is inductively or capacitively coupled, and a direct current plasma system. U.S. Pat. No. 4,981,818 provides teachings relating to the tuning or matching of networks required for electrically coupling electrical energy to generated plasma when depositing diamond using either the RF or microwave plasma systems. European patent application 286396 additionally provides examples of methods for growing polycrystalline diamond on top of single crystal silicon. Also relevant to the ensuing description are the preferred methods for etching diamond films. Diamond film can be etched in an oxygen plasma at temperatures ranging from 30 to 300 C.

FIG. 1 illustrates one embodiment of the invention wherein a CVD diamond heat spreader layer 14 deposited on the surface of silicon substrate 12. Chip 10 is mounted to the substrate 12 using solder balls 16 which are disposed within the diamond layer 14. The preferred method of processing the illustrated structure is to deposit a conformal diamond layer 14 on the surface of the silicon substrate 12, followed by etching a pattern of holes in the diamond layer to expose areas of the underlying bonding pad in alignment with the C4 solder balls 16 of the chip 10. An alternative process flow would be to deposit the diamond layer on the chip, followed by etching holes and depositing the C4 solder balls for bonding with the substrate. Yet another alternative process flow comprising bonding the chip to the substrate followed by growing the diamond layer between them. A drawback to the latter process flow would be the difficulty of successfully depositing continual diamond material between the C4 connections. Since heat from the chip will be conducted through the C4 connections and then dissipated by the diamond layer, it is optimal that each C4 be in close thermal contact with the diamond layer.

Figure 2A:
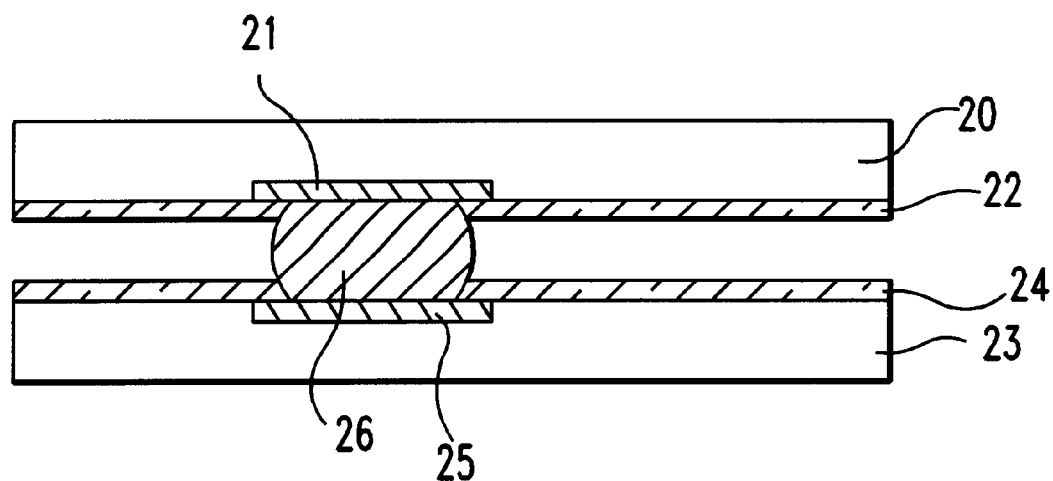
FIGS. 2A–2D are schematic illustrations of proposed chip-to-chip packaging structures having CVD diamond thermal conducting layers in accordance with the present invention.

FIG. 2A provides an alternative chip bonding package in accordance with the present invention. Each of the substrates, 20 and 23, has a diamond thin film layer deposited on its bonding surface (i.e., the surface facing the structure to which it is to be bonded and having at least one bonding site disposed on that surface). The FIG. 2A embodiment applies to chip-to-chip packaging, as well as chip-to-package or chip-to-heat sink structures. What is novel in the illustrated embodiment is the existence of a diamond thermal layer on each of the bonding surfaces, thereby providing thermal paths on each side of the structure to direct heat away from the point of connection and, presumably, away from the active, heat-generating areas of the structure.

Figure 2B:
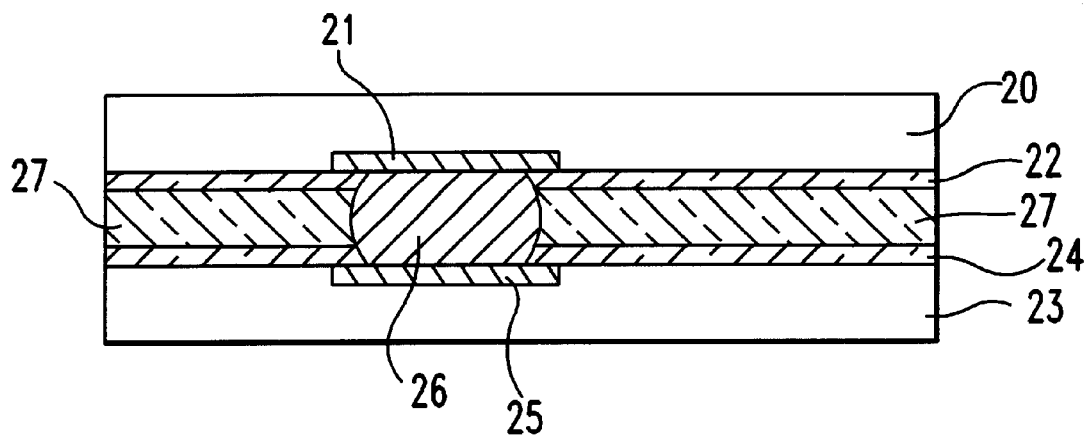

FIG. 2B illustrate the dual diamond surface structure with an additional layer 27 of diamond material disposed between the two diamond layers 22 on substrate 20 and 24 on substrate 23. The FIG. 2B structure will provide even better conduction of heat away from the active areas, particularly given the ability of the solder to conduct heat to the center thermal layer 27. As with the structure of FIG. 2A, there are several alternative process flows which could be undertaken to arrive at the illustrated structure. The intermediate layer 27 could be grown after formation of layers 22 and 23 and after bonding of solder connection 26 between the bonding pads 21 and 25. Alternatively, layer 27 could be deposited along with or after deposition of one of the thin film layers 22 and 23, with etching into both the intermediate layer and the thin film to expose the underlying bonding pads and to provide holes for the solder balls.

Figure 2C:
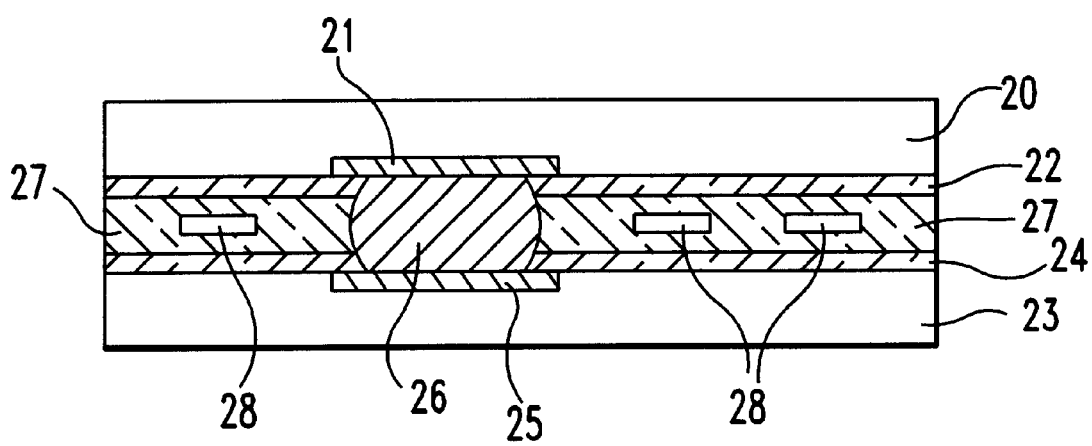

Yet another implementation of a chip-to-chip package is the embodiment illustrated in FIG. 2C, wherein the intermediate layer 27 includes a plurality of heat conducting channels disposed through the intermediate diamond layer. The heat channels are provided as paths which conduct heat away from the active devices even more effectively than does the diamond layer. That channel heat conduction may be by air cooling through the channels or by passing a cooling fluid through the channels.

Figure 2D:
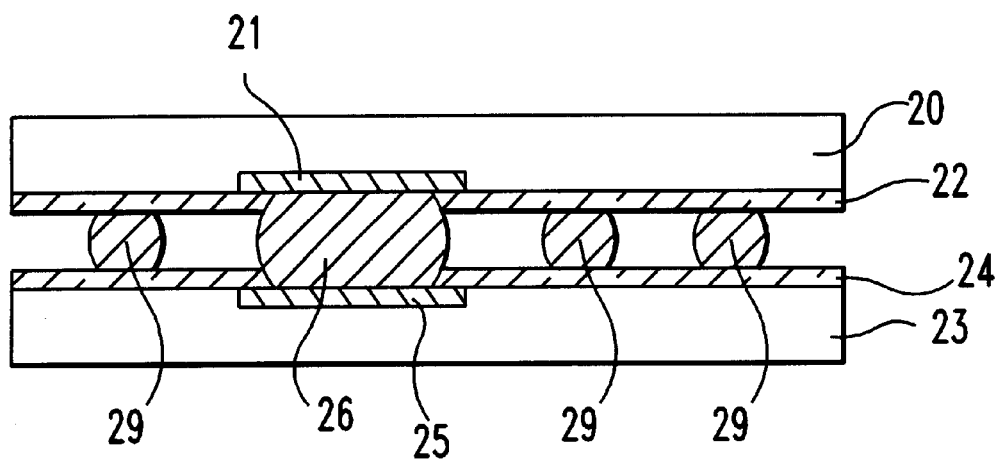

Still another implementation of a chip-to-chip package is the embodiment illustrated in FIG. 2D wherein additional thermal conductors 29 are disposed between the two bonded structures. The additional thermal conductors are disposed between the diamond layers 22 and 24 and are not electrically connected to the underlying metallurgy of the bonded structures. The additional thermal conductors are preferably fabricated of the same material as the C4 solder bump connectors, in order to optimally match the thermal coefficients of expansion of the associated materials in order to reduce the thermal and mechanical stresses. In addition, if the conducting and non-conducting balls are made of the same material, they can be deposited in a single step to eliminate complexity of processing. The number of solder balls, including a quantity of non-connected thermal conductors, is limited only by the ground rules of the structure and can be standardized, with a chip designer determining which are to be electrically connected. It is preferable to include a thin adhesion layer of 10–200 angstroms of Ti, Cr or similar material. A proposed process flow for fabricating the embodiment illustrated in FIG. 2D is to deposit the diamond film, for example 22, on the bonding surface (again, meaning the surface which faces the structure to which it is to be bonded and which has at least one bonding site disposed thereon) of the substrate 20 followed by patterning of the diamond layer by dry etching to form holes. The solder balls would then be deposited or plated with a separate lithography step, followed by bonding to exposed areas on the adjacent structure.

Figure 3:
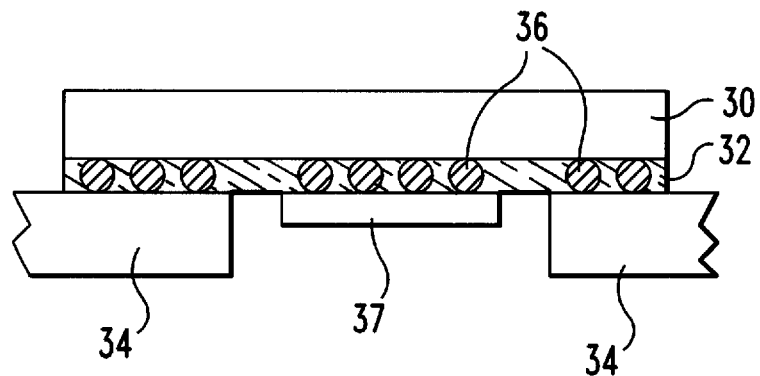
FIG. 3 shows a schematic rendering of a silicon-on-silicon MCM package in accordance with the present invention.

FIG. 3 shows a schematic rendering of a silicon-on-silicon MCM package in accordance with the present invention. Chip 30 is bonded to chip 37 as well as to board 34 by solder connections 36. The solder connectors are disposed in a diamond thin film thermal conductor layer, as detailed at length above with reference to FIGS. 1 and 2A–2D. By directly soldering a smaller peripheral chip to the larger chip, such as the CPU chip, one can enhance the performance and bandwidth of the structure and can reduce cost. The inventive structure shown in FIG. 3 has a chip stack structure where chip 37 is soldered to chip 30 using the diamond film C4 process detailed above. The top chip is subsequently soldered to the packaging board substrate 34 as in the prior art. Without the use of the high heat conduction diamond film, the heat generated in the stacked chip could not be dissipated. With the present invention, however, the diamond film provides a highly conducting thermal channel from the center to the board.

Figure 4:
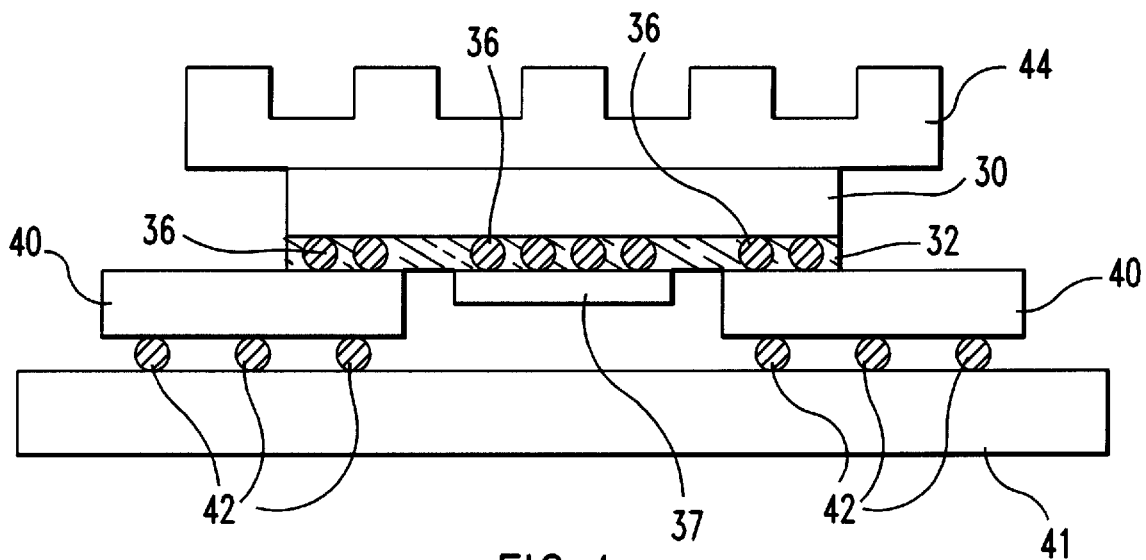
FIG. 4 provides a schematic illustration of a structure comprising a silicon-on-silicon MCM package with associated heat sink.

A more complete view of the stacked chip structure is shown in FIG. 4 which provides a schematic illustration of a structure comprising a silicon-on-silicon MCM package with associated heat sink. Chip 37 is connected to chip 30 by solder connections 36 disposed in diamond film 32. Chip 30 is, in turn, soldered to the alumina substrate 40. The alumina substrate 40 is attached to the circuit board 41 via solder connections 42 in a ball grid array in accordance with the prior art. In addition, heat sink 44 is directly attached to the back of chip 30 to provide yet another dissipation path, preferably using forced air flow along the fins.

FIG. 5 provides a chart illustrating the simulated thermal cooling results for the inventive embodiment of FIG. 4. As shown by the chart, assuming a chip 30 which is 14 mm and has a power value of 15 watts and a chip 37 which is 6 mm and has a power rating of 5 watts, the diamond layer structure provides more than a 10 degree temperature differential at the chip, even without the use of additional fluid cooling. Clearly, therefore, the use of diamond thermal conduction layers can provide enhanced cooling without unduly stressing the substrate, due to the more closely matched TCE.

Figure 6C:
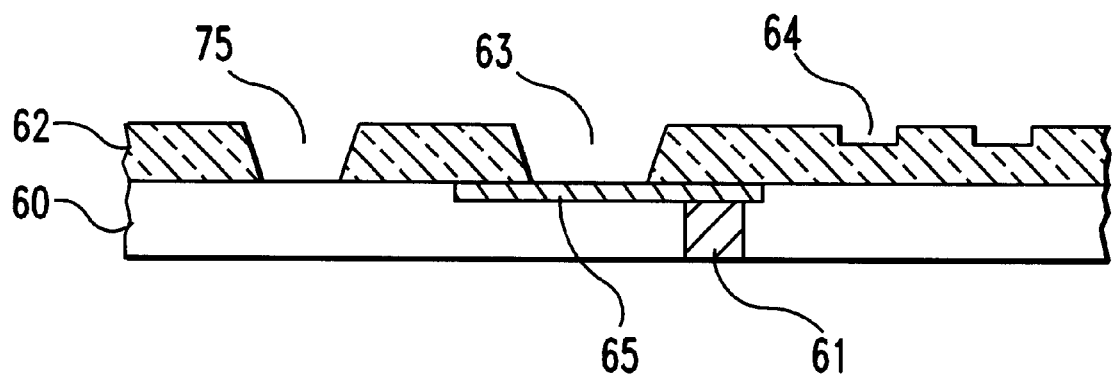
Figure 6D:
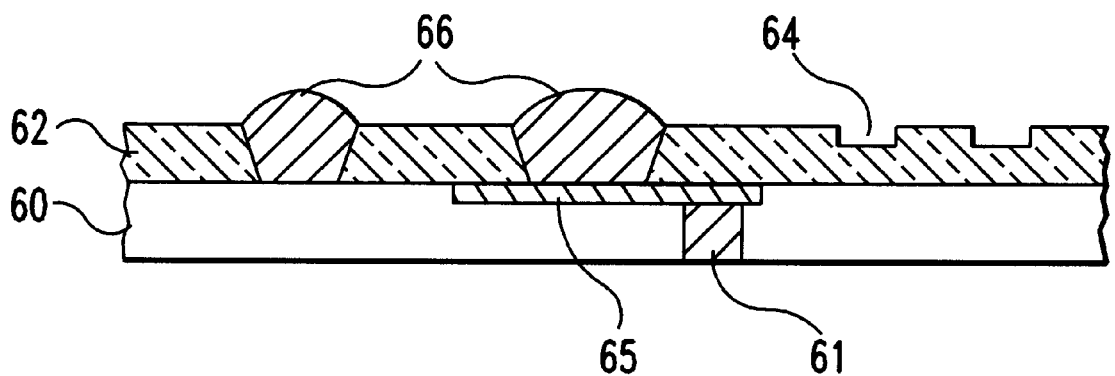
Figure 6E:
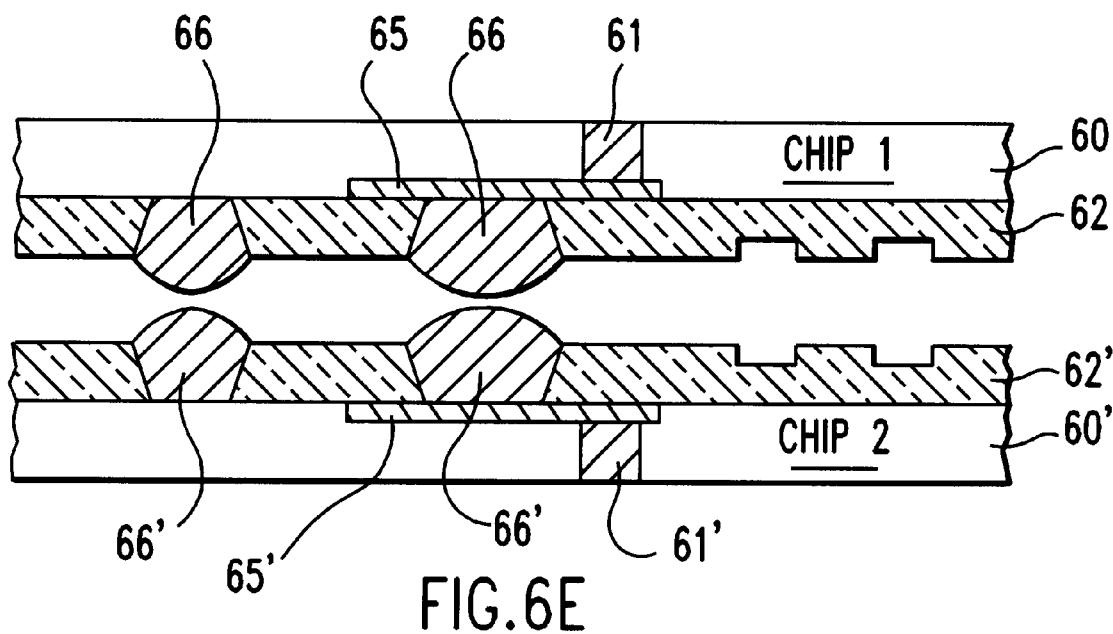
Figure 6F:
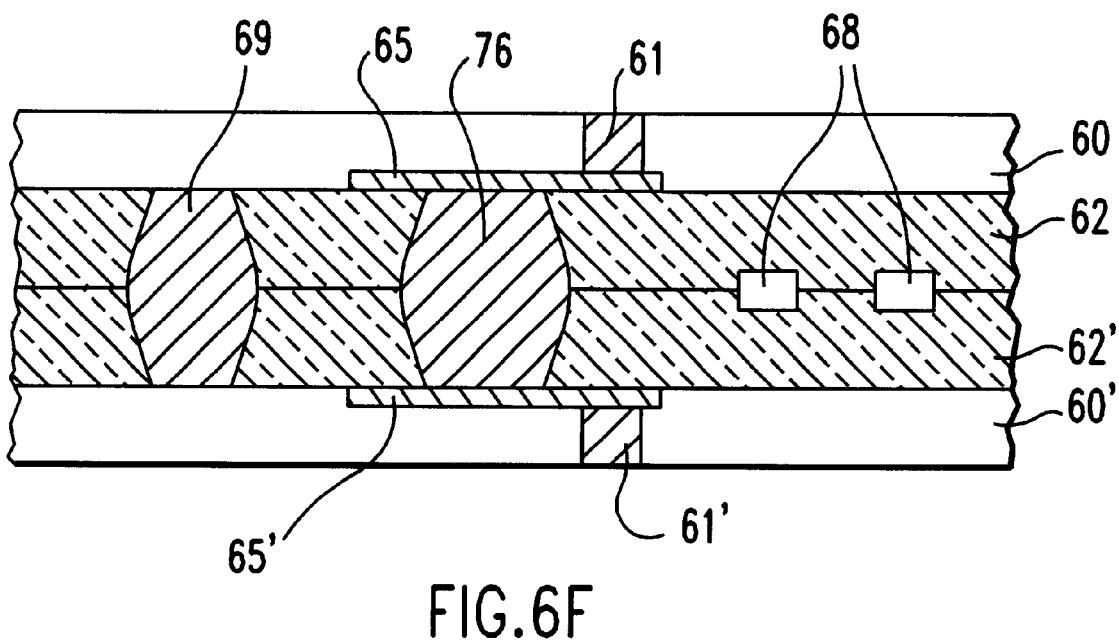

FIGS. 6A through 6F provide illustrations of processing steps for a representative process flow in accordance with the present invention. A substrate 60, having a bonding site 65 in electrical connection with a metal via 61 is shown in FIG. 6A. A conformal diamond layer 62 is provided on the substrate, as shown in FIG. 6B, using one of the aforementioned diamond deposition techniques. Thereafter, the diamond layer is patterned, in accordance with known techniques (e.g., $0_2$ dry etch) to form the holes 63, 64 and 75 as illustrated in FIG. 6C. Hole 63 is provided to expose the underlying bonding site for bonding and electrical connection to the substrate. Hole 64 comprises an etched site which extends only partially into the depth of the diamond layer. Such a hole comprises part of a cooling channel as depicted in FIG. 2C. Finally, the hole which is shown at 75 of FIG. 6C comprises a hole which exposes the underlying silicon, but not in alignment with a bonding site. Hole 65 would accommodate the additional non-connected thermal conductors which are illustrated in FIG. 2D. As will be readily apparent to one having skill in the art, if a single structure is to include all of holes 63, 64 and 75, several masking and etching steps would be required to effect the desired hole profile. Subsequent to hole formation, Sn/Pb solder balls 66 are deposited in the desired holes, as shown in FIG. 6D. As shown in FIG. 6E, two substrates formed in accordance with the foregoing process are brought together in alignment. The package is then heated to between 100 and 200C to cause the solder balls 66 and 61' to flow together and effect bonding of the two substrates. FIG. 6F illustrates a structure formed in accordance with the foregoing process flow. The structure includes two chips, 60 and 60' a plurality of electrically connecting C4 connections, 76 a plurality of additional non-connected thermal conductors, 69 and a plurality of cooling channels 68 in the "intermediate" diamond layer 67 which is formed from the two diamond layers 62 and 62'.

While the present invention has been described with reference to several preferred materials and structures, modifications by one skilled in the art cannot be made without departing from the spirit and scope of the invention as set forth in the appended claims.

Having thus described our invention, what we claim as new and desire to secure by Letters Patent is:

1. A semiconductor structure comprising:
    a first chip comprising at least one semiconductor component formed in a silicon substrate and having a first surface and a second surface;
    a first chip diamond layer disposed on said second surface;
    at least one connector formed at said second surface of said first chip; and
    a bonded structure having a first bonded structure surface bonded to said at least one connector and a second bonded structure surface.

2. The structure of claim 1 wherein said bonded structure additionally comprises a second bonded structure diamond layer disposed on said first bonded structure surface.

3. The structure of claim 2 wherein said bonded structure comprises at least one bonding site and wherein said second diamond layer comprises a conformal layer having a pattern of at least one hole for exposing said at least one bonding site.

4. The structure of claim 1 further comprising an intermediate diamond layer disposed between said first chip and said bonded structure.

5. The structure of claim 4 wherein said intermediate diamond layer additionally comprises a plurality of heat conduction channels disposed in said intermediate diamond layer.

6. The structure of claim 5 further comprising cooling fluid disposed in said heat conduction channels.

7. The structure of claim 2 further comprising an intermediate diamond layer disposed between said first chip and said bonded structure.

8. The structure of claim 7 wherein said intermediate diamond layer additionally comprises a plurality of heat conduction channels disposed in said intermediate diamond layer.

9. The structure of claim 8 further comprising cooling fluid disposed in said heat conduction channels.

10. The structure of claim 3 further comprising an intermediate diamond layer disposed between said first chip and said bonded structure.

11. The structure of claim 10 wherein said intermediate diamond layer additionally comprises a plurality of heat conduction channels disposed in said intermediate diamond layer.

12. The structure of claim 11 further comprising cooling fluid disposed in said heat conduction channels.

13. The structure of claim 1 wherein said at least one connector comprises a first plurality of electrical connectors and a second plurality of thermal connectors.

14. The structure of claim 1 wherein said at least one connector comprises at least two connectors and further comprising a second chip bonded to said first chip by at least one of said at least two connectors.

15. The structure of claim 1 further comprising a heat sink bonded to the second surface of said first chip.

16. The structure of claim 14 further comprising a heat sink bonded to the second surface of said first chip.

17. The structure of claim 16 wherein said bonded structure comprises at least one additional connector at its second bonded structure surface and further comprising a printed circuit card connected to said at least one additional connector.

* * * * *